US006444588B1

(12) United States Patent
Holscher et al.

(10) Patent No.: US 6,444,588 B1
(45) Date of Patent: Sep. 3, 2002

(54) ANTI-REFLECTIVE COATINGS AND METHODS REGARDING SAME

(75) Inventors: Richard Holscher; Zhiping Yin, both of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/299,357

(22) Filed: Apr. 26, 1999

(51) Int. Cl.$^7$ ............................................... H01L 21/76
(52) U.S. Cl. ........................ 438/737; 438/735; 438/757
(58) Field of Search ................................ 438/723, 724, 438/733, 737, 757, 735

(56) References Cited

U.S. PATENT DOCUMENTS

| 4,352,724 A | | 10/1982 | Sugishima et al. | 204/192.37 |
| 4,451,969 A | * | 6/1984 | Chaudhuri | 438/62 |
| 4,764,248 A | | 8/1988 | Bhattacherjee et al. | 438/439 |
| 4,921,572 A | * | 5/1990 | Roche | 156/653 |
| 5,194,777 A | | 3/1993 | Nakaya et al. | 313/509 |
| 5,216,542 A | | 6/1993 | Szczyrbowski et al. | 359/588 |
| 5,270,241 A | | 12/1993 | Denison et al. | 438/396 |

(List continued on next page.)

FOREIGN PATENT DOCUMENTS

| JP | 61-59820 | 3/1986 |
| JP | 3-101147 | 9/1989 |
| JP | 09-134914 | 8/1995 |
| JP | 8-31811 | 8/1996 |
| JP | 8-31812 | 8/1996 |
| WO | WO 99/10918 | 3/1999 |

OTHER PUBLICATIONS

Bencher et al., "Dielectric antireflective coatings for DUV lithography," *Solid State Technology* 109,111–112,114 (1997).

Dammel et al., "Dependence Of Optical Contants Of AZ®BARLi™ Bottom Coating On Bake Conditions," *SPIE 3049*:963–973 (1997).

Gocho et al., "CVD Method of Anti–Reflective Layer Film for Excimer Laser Lithography," *Int. Conf. On Solid State Devices & Materials*, Makuhari, Aug. 29–Sep. 1, 570–572 (1993).

Heavens, *Optical Properties of Thin Solid Films*, Dover Publications, Inc., New York, NY, 48–49 (1955).

Jenkins et al., *Fundamentals of Optics*, McGraw–Hill Book Company, Inc., New York, NY Section 1.4; 9–10 (1957).

Ong et al., "CVD $SiN_x$ Anti–reflective Coating for Sub–0.5μm Lithography," *Symposium on VLSI Technology Digest of Technical Papers*, 73–74 (1995).

Wolf et al., *Silicon Processing for the VLSI Era*, vol. 1—Process Technology, Lattice Press, Sunset Beach, CA, 437–441 (1990).

Yin, "Chapter 5. Density and Composition of a–$Si_xN_yH_z$ Films," *Optical Properties of Amorphous Silicon Nitride Films*, a dissertation submitted to the Graduate Faculty of The City University of New York, 70–91 (1991).

*Primary Examiner*—Michael Trinh
*Assistant Examiner*—Jeff Vockrodt
(74) *Attorney, Agent, or Firm*—Mueting, Raasch & Gebhardt, P.A.

(57) ABSTRACT

A method of forming an anti-reflective coating material layer in the fabrication of integrated circuits includes providing a substrate assembly having a surface and providing an inorganic anti-reflective coating material layer on the substrate assembly surface. The inorganic anti-reflective coating material layer has an associated first etch rate when exposed to an etchant. The method further includes thermally treating the inorganic anti-reflective coating material layer formed thereon such that the thermally treated anti-reflective coating material layer then has an associated second etch rate less than the first etch rate when exposed to the etchant, e.g., the second etch rate is less than 16 Å/minute, the second etch rate is less than 20% of the first etch rate, etc.

78 Claims, 3 Drawing Sheets

U.S. PATENT DOCUMENTS

| | | | |
|---|---|---|---|
| 5,374,585 A | 12/1994 | Smith et al. | 438/443 |
| 5,418,019 A | 5/1995 | Chen et al. | 427/579 |
| 5,441,914 A | 8/1995 | Taft et al. | 438/592 |
| 5,510,271 A | 4/1996 | Rohatgi et al. | 438/57 |
| 5,539,249 A | 7/1996 | Roman et al. | 257/649 |
| 5,580,815 A | 12/1996 | Hsu et al. | 438/362 |
| 5,639,687 A | 6/1997 | Roman et al. | 438/69 |
| 5,677,111 A | 10/1997 | Ogawa | 430/313 |
| 5,698,352 A | 12/1997 | Ogawa et al. | 430/14 |
| 5,710,067 A | 1/1998 | Foote et al. | 438/636 |
| 5,716,535 A * | 2/1998 | Lee et al. | 216/99 |
| 5,747,388 A | 5/1998 | Küsters et al. | 438/723 |
| 5,766,964 A | 6/1998 | Rohatgi et al. | 438/72 |
| 5,796,151 A | 8/1998 | Hsu et al. | 257/410 |
| 5,886,391 A | 3/1999 | Niroomand et al. | 257/510 |
| 5,994,217 A | 11/1999 | Ng | 438/636 |
| 6,103,456 A | 8/2000 | Tobben et al. | 430/317 |
| 6,117,741 A * | 9/2000 | Chatterjee et al. | 438/299 |
| 6,121,133 A | 9/2000 | Iyer et al. | 438/636 |
| 6,124,178 A | 9/2000 | Sung et al. | 438/308 |
| 6,127,262 A | 10/2000 | Huang et al. | 438/634 |
| 6,174,590 B1 | 1/2001 | Iyer et al. | 428/209 |
| 6,274,292 B1 | 8/2001 | Holscher et al. | 430/313 |

* cited by examiner

ANTI-REFLECTIVE COATINGS AND METHODS REGARDING SAME

FIELD OF THE INVENTION

The present invention relates to the fabrication of integrated circuits. More particularly, the present invention relates to anti-reflective layers used in such fabrication.

BACKGROUND OF THE INVENTION

One important process in fabrication of integrated circuits (ICs) is photolithography. Generally, photolithography involves reproducing an image from a mask in a layer of photoresist that is supported by underlying layers of a semiconductor substrate assembly. Photolithography is a very complicated and critical process in the fabrication of ICs. The ability to reproduce precise images in a photoresist layer is crucial to meeting demands for increasing device density.

In the photolithographic process, first an optical mask is positioned between the radiation source and the photoresist layer on the underlying layers of a semiconductor substrate assembly. A radiation source can be, for example, visible light or ultraviolet radiation. Then, the image is reproduced by exposing the photoresist to radiation through the optical mask. Portions of the mask contain an opaque layer, such as, for example, chromium, that prevents exposure of the underlying photoresist. The remaining portions of the mask are transparent, allowing exposure of the underlying photoresist.

The layers underlying the photoresist layer generally include one or more individual layers that are to be patterned. That is, when a layer is patterned, material from the layer is selectively removed. The ability to pattern layers and material enables ICs to be fabricated. In other words, the patterned layers are used as building blocks in individual devices of the ICs. Depending on the type of photoresist used (e.g., positive type or negative type photoresist), exposed photoresist is either removed when the substrate is contacted with a developer solution, or the exposed photoresist becomes more resistant to dissolution in the developer solution. Thus, a patterned photoresist layer is able to be formed on the underlying layers.

One of the problems experienced with conventional optical photolithography is the difficulty of obtaining uniform exposure of the photoresist underlying transparent portions of the mask. It is desired that the light intensity exposing the photoresist be uniform to obtain optimum results.

When sufficiently thick layers of photoresist are used, the photoresist must be or become partially transparent so that photoresist at the surface of underlying layers is exposed to a substantially similar extent as the photoresist at the outer surface. Often, however, light that penetrates the photoresist is reflected back toward the radiation source from the surface of the underlying layers of the substrate assembly. The angle at which the light is reflected is at least in part dependent upon the topography of the surface of the underlying layers and the type of material of the underlying layers. The reflective light density can vary in the photoresist throughout its depth or partially through its depth, leading to non-uniform exposure and undesirable exposure of the photoresist. Such exposure of the photoresist can lead to poorly controlled features (e.g., gates, metal lines, etc.) of the ICs.

In an attempt to suppress reflectivity, or in other words to minimize the variable reflection of light in a photoresist layer, anti-reflective coatings, i.e., anti-reflective layers, have been used between the underlying layers of a substrate assembly and the photoresist layer or between the photoresist layer and the radiation source. Such anti-reflective coatings suppress reflectivity from the underlying substrate assembly allowing exposure across a photoresist layer to be controlled more easily from the radiation incident on the photoresist from the radiation source.

Anti-reflective coatings can be formed of organic materials. Organic layers can, however, lead to particle contamination in the integrated circuit (IC) due to the incomplete removal of organic material from the underlying layers after the photolithography step is performed. Such particle contamination can potentially be detrimental to the electrical performance of the IC. Further, the underlying layers upon which the organic materials are formed may be uneven, resulting in different thicknesses of the organic material used as the anti-reflective coating, e.g., thicker regions of organic material may be present at various locations of the underlying layers. As such, when attempting to remove such organic material, if the etch is stopped when the underlying layers are reached, then some organic material may be left. If the etch is allowed to progress to etch the additional thickness in such regions or locations, the underlying layers may be undesirably etched.

Further, inorganic anti-reflective layers have also been introduced for suppressing reflectivity in the photolithography process. For example, silicon-rich silicon dioxide, silicon-rich nitride, and silicon-rich oxynitride have been used as inorganic anti-reflective layers, such as in the patterning of metal lines and gates.

After a patterned photoresist layer is formed on a substrate assembly, many other processes are typically performed in the fabrication of ICs. For example, the photoresist can act as an implantation barrier during an implant step, the photoresist can be used to define the outer perimeter of an area (e.g., a contact hole) that is etched in one or more underlying layers of the substrate assembly, or the photoresist may be used in any other typically used fabrication process. In many of such cases, the photoresist acts as a barrier during the etching process, such that only selective material of the one or more underlying substrate assembly layers is removed.

After the processes involving photolithographic techniques are carried out (e.g., implantation, etching, etc.), in many circumstances not only must the photoresist material used in the photolithographic process be removed, but the anti-reflective coating may also be removed. For example, in many cases, the photoresist and the anti-reflective coating used to define the contact opening needs to be removed prior to subsequent processing of the structure. However, in many other circumstances, after the photoresist material used in the photolithographic process is removed, the anti-reflective coating is still required in later processing steps. Therefore, the anti-reflective coating is not removed. For example, the anti-reflective coating may be used to level the topography to increase dimensional stability of later deposited lines. Further, anti-reflective coatings in subsequent processing steps may also include use of the anti-reflective coating as an etch stop layer, such as for self-aligned contact etch processes or for other etch hardmask techniques.

Generally, anti-reflective coatings used for photolithographic processing are easily removed using wet etchants. Such removal of the anti-reflective coatings may even be removed during the etching of layers underlying the anti-reflective coating and patterned photoresist during photolithographic processing. Such ease of removal of the anti-reflective coatings is not always desirable.

SUMMARY OF THE INVENTION

There is a need for inorganic anti-reflective coating material layers used in photolithographic processing which are not easily removed such that the layers can be used in later processing steps. Anti-reflective coating material layers according to the present invention have decreased wet etch rates relative to conventionally used inorganic anti-reflective coatings. As described herein, the etch rate of an inorganic anti-reflective coating material layer is decreased to desired levels as a function of thermally treating, e.g., annealing, the inorganic anti-reflective coating material layer.

A method of forming an anti-reflective coating material layer in the fabrication of integrated circuits according to the present invention includes providing a substrate assembly having a surface and providing an inorganic anti-reflective coating material layer on the substrate assembly surface. The inorganic anti-reflective coating material layer has an associated etch rate when exposed to an etchant. The method further includes thermally treating the inorganic anti-reflective coating material layer formed thereon at a temperature in the range of about 400° C. to about 1100° C. such that the thermally treated anti-reflective coating material layer has an associated etch rate of less than about 16 Å per minute when exposed to the etchant.

Another method according to the present invention for use in the fabrication of integrated circuits includes providing a substrate assembly having a surface and providing an inorganic anti-reflective coating material layer on the substrate assembly surface. The inorganic anti-reflective coating material layer has an associated first etch rate when exposed to an etchant. Further, the method includes providing a layer of resist material over the inorganic anti-reflective coating material layer, patterning the layer of resist material resulting in exposed regions of the inorganic anti-reflective coating material layer and unexposed regions of the inorganic anti-reflective coating material layer, removing the exposed regions of the inorganic anti-reflective coating material layer, and removing the patterned layer of resist material. The unexposed regions of the inorganic anti-reflective coating material layer are thermally treated such that the thermally treated unexposed regions of the anti-reflective coating material layer have an associated second etch rate less than the first etch rate.

Another method for use in the fabrication of integrated circuits according to the present invention includes providing a substrate assembly having a surface and providing an inorganic anti-reflective coating material layer on the substrate assembly surface. The inorganic anti-reflective coating material layer is annealed to alter the optical properties thereof. The method further includes providing a layer of resist material over the inorganic anti-reflective coating material layer, patterning the layer of resist material resulting in exposed regions of the inorganic anti-reflective coating material layer and unexposed regions of the inorganic anti-reflective coating material layer, removing the exposed regions of the inorganic anti-reflective coating material layer and at least a portion of the substrate assembly thereunder, and removing the patterned layer of resist material. Then the unexposed regions of the inorganic anti-reflective coating material layer are thermally treated to alter the etch rate of the unexposed regions of the anti-reflective coating material layer.

In yet another method according to the present invention for use in the fabrication of integrated circuits, the method includes providing a substrate assembly having a surface and providing an inorganic anti-reflective coating material layer on the substrate assembly surface. The inorganic anti-reflective coating material layer has an associated first etch rate when exposed to an etchant. The method further includes providing a layer of resist material over the inorganic anti-reflective coating material layer, patterning the layer of resist material resulting in exposed regions of the inorganic anti-reflective coating material layer defining at least one opening in the substrate assembly, removing the exposed regions of the inorganic anti-reflective coating material layer, etching the substrate assembly resulting in the at least one opening therein, and removing the patterned layer of resist material. The inorganic anti-reflective coating material layer remaining after the exposed regions are removed is then thermally treated such that the thermally treated remaining anti-reflective coating material layer has an associated second etch rate less than the first etch rate. Further, the substrate assembly is etched such that regions of the substrate assembly underlying the remaining anti-reflective coating material layer are removed and then the opening is filled with a material such that a void is formed in the opening.

Another method according to the present invention is described. The method includes providing a substrate assembly having a surface and providing an inorganic anti-reflective coating material layer on the substrate assembly surface. The inorganic anti-reflective coating material layer has an associated first etch rate when exposed to an etchant and the inorganic anti-reflective coating material layer includes regions thereof removed such that one or more openings are formed in the substrate assembly. The inorganic anti-reflective coating material layer remaining after the regions are removed are thermally treated such that the thermally treated remaining anti-reflective coating material layer has an associated second etch rate less than the first etch rate. The substrate assembly is etched such that regions of the substrate assembly underlying the thermally treated anti-reflective coating material layer are removed and the opening is filled with a material such that a void is formed in the opening.

The methods above may include one or more of the following features or steps: the thermally treated anti-reflective coating material layer may have an associated etch rate of less than about 10 Å per minute when exposed to the etchant; the thermally treated anti-reflective coating material layer may have an associated etch rate of less than about 5 Å per minute when exposed to the etchant; the inorganic anti-reflective coating material layer may be $Si_xO_yN_z$:H, where x is in the range of about 0.39 to about 0.65, y is in the range of 0.25 to about 0.56, and z is in the range of about 0.05 to about 0.14; the inorganic anti-reflective coating material layer may have a thickness in the range of about 100 Å to about 1000 Å; the thermal treatment may include a furnace anneal at a temperature in the range of about 400° C. to about 1050° C. for a time period in the range of about 15 minutes to about 45 minutes; the thermal treatment may include subjecting the inorganic anti-reflective coating material layer to a rapid thermal anneal at a temperature in the range of about 500° C. to about 1100° C. for a time period in the range of about 1 second to about 3 minutes; the thermal treatment may include subjecting the inorganic anti-reflective coating material layer to a rapid thermal nitridation anneal at a temperature in the range of about 850° C. to about 1050° C. for a time period in the range of about 1 second to about 60 seconds; the etchant may include one of a hydrofluoric acid containing etchant and an etchant composition comprising a fluoride salt and a mineral acid.

In yet another method of forming an anti-reflective coating material layer in the fabrication of integrated circuits, the method includes providing a substrate assembly having a surface and an inorganic anti-reflective coating material layer on the substrate assembly surface. The inorganic anti-reflective coating material layer has an associated etch rate when exposed to an etchant. The inorganic anti-reflective coating material layer is thermally treated at a temperature in the range of about 400° C. to about 1100° C. An associated etch rate for the thermally treated anti-reflective coating material layer is less than about 20% of the associated etch rate for the inorganic anti-reflective coating material layer prior to being thermally treated.

Yet further, a method of etching in the fabrication of integrated circuits according to the present invention includes providing a substrate assembly having a surface. The substrate assembly surface includes BPSG with the BPSG having an associated etch rate when exposed to an etchant. The method further includes providing an inorganic anti-reflective coating material layer relative to the substrate assembly surface and thermally treating the inorganic anti-reflective coating material layer at a temperature in the range of about 400° C. to about 1100° C. The thermally treated anti-reflective coating material layer has an associated etch rate when exposed to the etchant. The ratio of etch rates between BPSG:anti-reflective coating material layer when exposed to the etchant is at least about 3:1, may be greater than about 20:1, and even greater than about 100:1. In addition, the ratio of etch rates between TEOS:anti-reflective coating material layer when exposed to the etchant is at least about 3:1, and may be greater than about 10:1.

An anti-reflective coating material layer according to the present invention consists essentially of $Si_xO_yN_z$:H, where x is in the range of about 0.39 to about 0.65, y is in the range of about 0.25 to about 0.56, z is in the range of about 0.05 to about 0.14. An etch rate for the inorganic anti-reflective coating material layer when exposed to an etchant is less than about 16 Å per minute, preferably less than about 10 Å per minute, and more preferably less than 5 Å per minute.

DETAILED DESCRIPTION OF THE EMBODIMENTS

The present invention shall be generally described with reference to FIGS. 1–6. It will be apparent to one skilled in the art that scaling in the figures does not represent precise dimensions of the various elements illustrated therein.

To provide better control of photolithography when forming integrated circuit (IC) structures, inorganic anti-reflective coating (ARC) layers, otherwise referred to as dielectric anti-reflective coatings (DARC), are used. Using such inorganic anti-reflective coating material layers results in uniform exposure of photoresist which has been formed on underlying layers of a substrate assembly due to at least, in part, suppression of reflectivity from the underlying layers of the substrate assembly. Thus, well-defined patterns are able to be reproduced in the photoresist. Forming well-defined patterns in the photoresist leads to well-defined patterning of underlying material. As device density is increasing in integrated circuit structures, such precise definition is becoming increasingly important.

It is to be understood that the term substrate assembly, as used herein, includes a wide variety of semiconductor based structures, including, but not limited to, semiconductor substrates and semiconductor substrates having one or more layers or regions formed thereon or therein. Semiconductor substrates can be a single layer of material, such as a silicon wafer, or it is understood to include silicon-on-sapphire (SOS) technology, silicon-on-insulator (SOI) technology, doped and undoped semiconductors, epitaxial layers of silicon supported by a base semiconductor, as well as other semiconductor substrate structures. When reference is made to a semiconductor substrate assembly in the following description, various process steps may have been used to form regions/junctions in a semiconductor substrate, or may have been used to form one or more layers or regions of material relative to the substrate.

Figure 1:
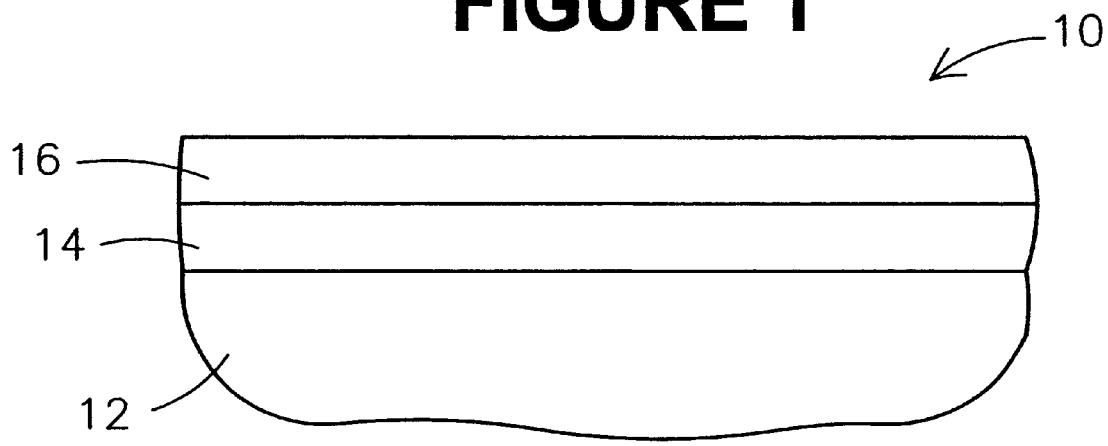
FIGS. 1–6 generally illustrate a fabrication process including thermal treatment of an inorganic anti-reflective coating material layer to decrease the etch rate thereof according to the present invention.
Figure 2:
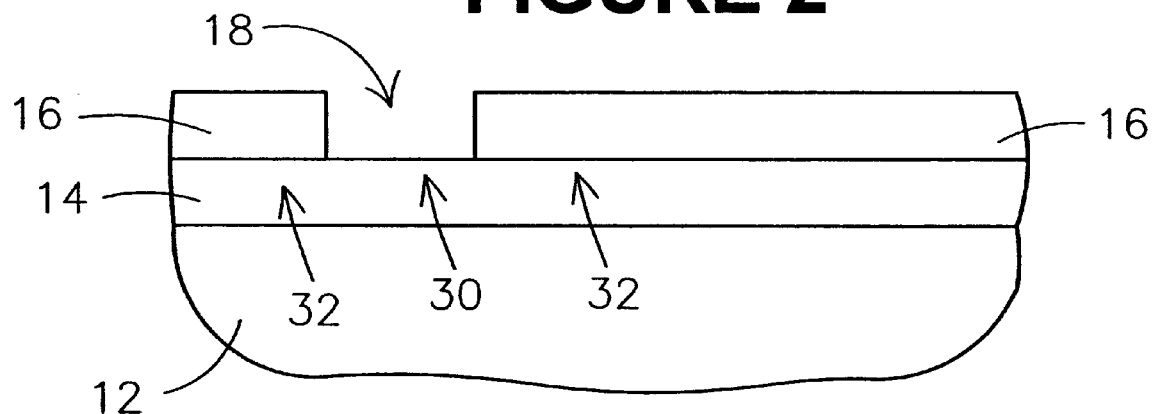
Figure 3:
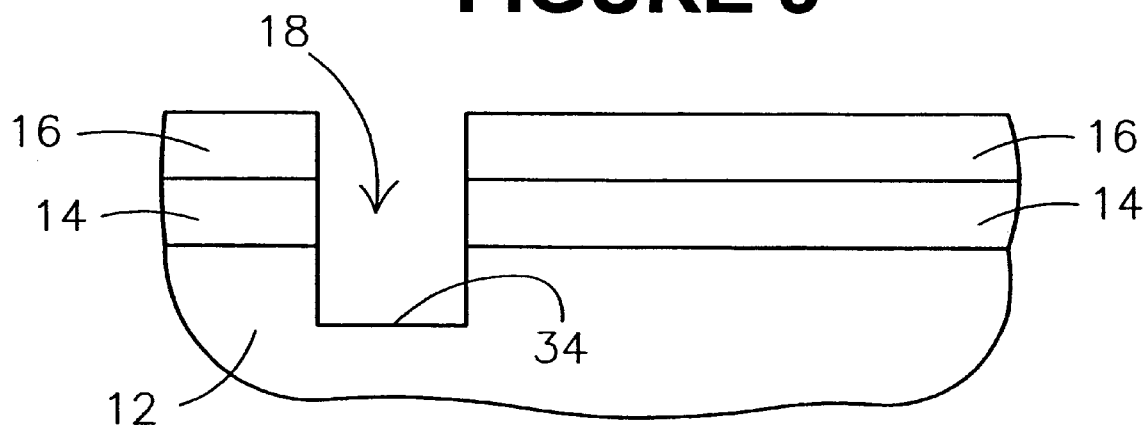
Figure 4:
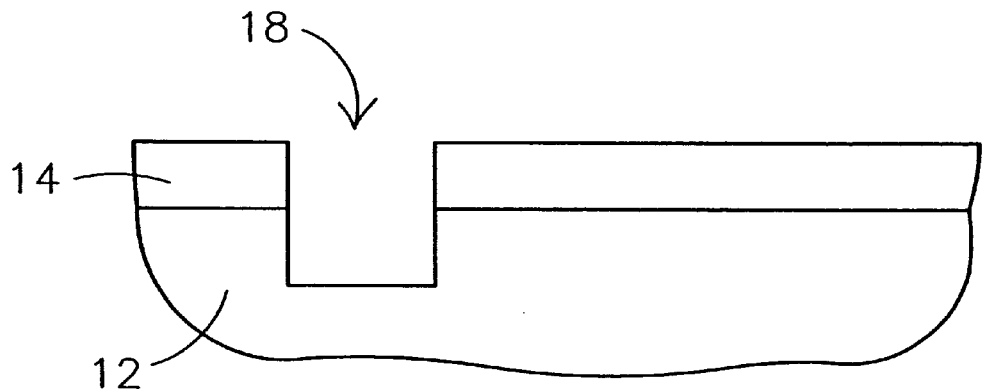
Figure 5:
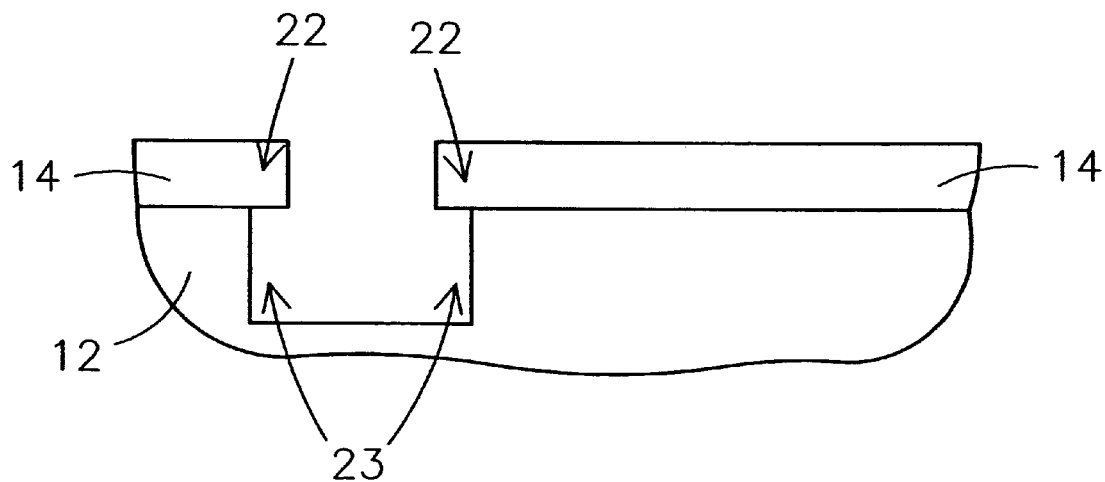
Figure 6:
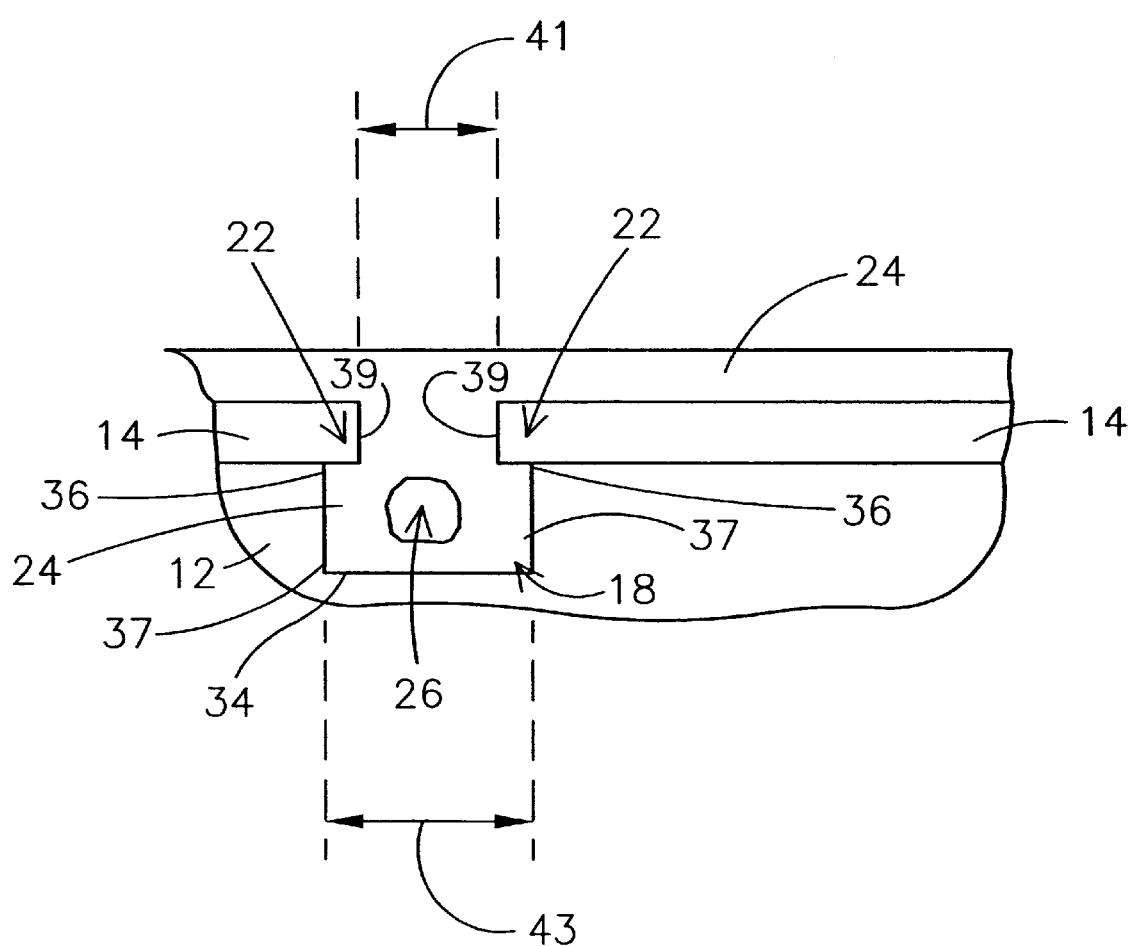

FIGS. 1–3 generally illustrate a method of defining an opening 18 in a substrate assembly 12. FIGS. 4–6, which includes a step of thermally treating anti-reflective coating material layer 14 according to the present invention to decrease the etch rate of the layer 14, show one illustrative use of such a decreased wet etch rate anti-reflective coating material layer in the fabrication of ICs.

As shown in FIG. 1, structure 10 includes a substrate assembly 12 having an inorganic anti-reflective coating material layer 14 formed thereon. Further, the structure 10 includes resist layer 16 formed over the anti-reflective coating material layer 14. The substrate assembly 12 may be formed of one or more different materials. For example, the substrate assembly 12 can comprise a silicon wafer in which an opening 18 is to be defined. Further, for example, the substrate assembly 12 may include a metal layer in which the opening 18 may be defined or, may include borophosphosilicate glass (BPSG) or tetraethylorthosilicate (TEOS) or any other oxide material in which a trench, such as for a capacitor, is formed. Yet further, for example, substrate assembly 12 may include material to be etched for performance of damascene processing.

As described above, the substrate assembly 12 may be a structure in which an opening or trench is defined for formation of a capacitor. In such a case, for example, the substrate assembly 12 may include a polysilicon containing region for connection to a bottom electrode of a storage cell capacitor deposited in the opening and may also include an insulative layer in which the opening 18 is formed such as an oxide layer, e.g., silicon dioxide, BPSG, phosphosilicate glass (PSG), etc. Further, as described above, the substrate assembly 12 may be a silicon substrate. Such a substrate may be etched for formation of isolation regions, e.g., shallow trench isolation. Yet further, as described above, the substrate assembly 12 may include oxide layers having openings defined therein for provision of interconnects. Therefore, the present invention is not to be taken as limited to any particular substrate assembly 12.

The anti-reflective coating materials described herein and the methods for using such anti-reflective coating materials may be used for any application requiring photolithographic processing. However, the present invention is particularly beneficial for use in defining openings where the decreased wet etch rates for the anti-reflective coating material is used to create overhangs in processing situations, e.g., allowing overetching and undercutting of a layer underlying the anti-reflective coating material layer. Further, such applications generally require the use of the anti-reflective properties of the inorganic anti-reflective coating material layer in later processing steps. For example, the present invention may be used in the formation of capacitors such as in the definition of openings for formation of cell electrodes in the definition of contact holes and vias through insulating layers, in the definition of trenches, etc. Yet further, for example, as described below, such applications may provide voids to decrease capacitance of structures or isolation regions.

A method of defining an opening in a substrate assembly 12, e.g., a silicon substrate or an oxide layer such as BPSG, is generally shown in FIGS. 1–3. As previously described with reference to FIG. 1, substrate assembly 12 includes anti-reflective coating material layer 14 and resist layer 16 formed thereon. Opening 18 is then defined in substrate assembly 12 using photolithography.

The inorganic anti-reflective coating material layer 14 formed over the substrate assembly 12 suppresses reflectivity from the substrate assembly 12 during the photolithography process used to define opening 18. The inorganic anti-reflective coating material layer 14 is formed having a thickness in the range of about 100 Å to about 1,000 Å. Preferably, the anti-reflective coating material layer 14 is an inorganic material. The preferred inorganic anti-reflective coating materials are preferably formed between the resist layer 16 and the underlying layer(s) of substrate assembly 12 for use in photolithographic processing. Suitable anti-reflective coating materials include an anti-reflective coating material having the preferred chemical formula $Si_xO_yN_z$:H. Preferably, x is in the range of about 0.39 to about 0.65, y is in the range of about 0.25 to about 0.56, and z is in the range of about 0.05 to about 0.14. In other words, the inorganic material may be a material comprising from about 25% to about 56% (by atomic concentration) oxygen, about 5% to about 14% (by atomic concentration) nitrogen, from about 39% to about 65% (by atomic concentration) silicon, and hydrogen. A specific example of anti-reflective coating material comprises about 10% (by atomic concentration) nitrogen, about 25% (by atomic concentration) oxygen, and about 65% (by atomic concentration) silicon.

The anti-reflective coating material layer 14 can, for example, consist of a single substantially homogenous layer of the above described inorganic material. Further, another example of the anti-reflective coating material layer 14 can comprise a stack of materials, with at least one of the materials in the stack being configured to attenuate radiation that passes through the resist layer 16. The attenuation can encompass either total or partial absorption of such radiation. If the attenuation encompasses only partial absorption, then preferably the radiation that is not absorbed will be reflected at an appropriate wavelength, such that it is canceled by other radiation passing through the stack. In the exemplary configuration of an anti-reflective coating material layer 14 comprising a stack of materials, the layer may include a material of about 25% to about 56% (by atomic concentration) oxygen, about 5% to about 14% (by atomic concentration) nitrogen, about 39% to about 65% (by atomic concentration) silicon, and hydrogen, at the bottom of the stack. The remainder of the stack may include one or more layers that are fully or partially transmissive of the radiation. For example, such layers may include, for example, silicon dioxide.

The inorganic anti-reflective coating material layer 14 may be formed by any method suitable for the composition ranges described above. For example, the inorganic anti-reflective coating material described above including nitrogen, oxygen, hydrogen and silicon, can be formed on substrate assembly 12 by chemical vapor deposition (CVD) at a temperature of from about 200° C. to about 400° C. Preferably, plasma-enhanced chemical vapor deposition (PECVD) is used. PECVD allows formation of the layer 14 at relatively low temperatures in the range of about 80° C. to about 400° C. In PECVD processes, the reacting gases are introduced into the reaction chamber which is at a relatively low pressure (i.e., low compared to ambient pressure). The reaction chamber is evacuated, such as by vacuum pumps, to remove undesirable reactive species. Then the reacting gas mixture, including the reacting gases, is introduced into the chamber. This is accomplished by one of various techniques. For example, the introduction into the chamber may be accomplished with the use of compounds which are gases at room temperature. It should be readily apparent that the techniques used for introduction of the compounds into the chamber may be varied and that the present invention is not limited to any particular technique, or limited to any particular reaction chamber. For example, the chemical vapor deposition can be carried out in a reactor chamber available from Genus, Inc., Applied Materials, Inc., or Novelus, Inc. However, any reaction chamber suitable for performing PECVD may be used.

Typically, the reacting gases are admitted into the chamber at separate inlet ports. In addition to the reactive species, a dilution gas may be flowed into the chamber. For example, helium may be flowed into the chamber to assist in providing uniformity to the layer being formed. In PECVD, a plasma is created by applying an electric field across the reaction gas mixture containing the reacting gases. The plasma adds energy to the reaction to draw the reaction to completion. Generally, as described above, the use of a plasma process allows the substrate assembly 12 to be kept at a somewhat lower temperature than other CVD processes. Any suitable power source may be used to generate the plasma in the reaction chamber. Suitable power sources include an RF generator, a microwave (e.g., 2.5 gigahertz microwave source) generator, or an electron cyclotron resonance (ECR) source. The preferred power source is an RF generator operating as a standard 13.56 megahertz source.

The anti-reflective coating material layer 16, e.g., the layer of $Si_xO_yN_z$:H, is formed by flowing a silicon-containing precursor gas, an oxygen gas-containing precursor gas, and a nitrogen-containing precursor gas into the reaction chamber. Generally, an inert dilution gas (e.g., helium, argon) is used as well. Preferably, a silicon-containing precursor gas may be any member of the silane family (e.g., silane, disilane, dichlorosilane, methylsilane, etc.). Preferably, the oxygen-containing precursor gas and the nitrogen-containing precursor gas are a single gas selected from the group of nitrous oxide ($N_2O$), NO, $N_2O_2$, and $NO_2$ or a combination thereof; preferably the gas is $N_2O$. However, the nitrogen-containing precursor and the oxygen-containing precursor may be provided as separate gases. When such precursors are separate gases, the oxygen-containing precursor may be selected from $O_2$, $O_3$, $N_2O$, NO, $N_2O_2$, and $NO_2$, or a combination thereof. The nitrogen-containing precursor may be selected from $N_2O$, NO, $N_2O_2$, $NO_2$, ammonia ($NH_3$), nitrogen ($N_2$), or a gas from the family of $[C_nH_{2n+1}]_2NH$ (e.g., $[CH_3]_2NH$), or combination thereof.

An anneal of the anti-reflective coating material layer 14 at a temperature of greater than about 400° C. has been found to alter optical properties of the anti-reflective coating material layer to make the anti-reflective coating material layer more absorptive to radiation. Such annealing of the anti-reflective coating material layer 14 to alter optical properties thereof is described in co-pending U.S. patent application Ser. No. 09/030,618 filed Feb. 25, 1998 and assigned to the same assignee hereof and entirely incorporated by reference herein. At least a portion of the layer 14 may be annealed at a temperature preferably greater than about 400° C. prior to formation of photoresist layer 16. The portion is preferably annealed at a temperature in the range of about 800° C. to about 1050° C., more preferably from about 800° C. to about 900° C., and most preferably about 850° C. During the anneal, the anti-reflective coating material layer 14 is preferably exposed to a nitrogen-containing atmosphere, such as an atmosphere comprising $N_2$ and Ar. The atmosphere can, for example, consist essentially of $N_2$.

Such an anneal is particularly beneficial for a portion of an anti-reflective coating material layer 14 comprising oxygen, nitrogen, silicon and hydrogen. Specifically, the anneal has been found to influence a refractive index coefficient (n) of the anti-reflective coating material layer 14 and an extinction coefficient (k), also referred to as the absorptive coefficient, of the anti-reflective coating material layer 14. For instance, it has been found that an anneal at greater than about 400° C. of a hydrogenated material comprising about 10% (by atomic concentration) nitrogen, about 25% (by atomic concentration) oxygen, and about 55% (by atomic concentration) silicon will alter the "n" and "k" of the material exposed to 248 nanometer wavelength light from 2.12 and 1.19, respectively, to 1.89 and 1.41, respectively. Also, the anneal will alter the "n" and "k" of such material when exposed to 365 nanometer wavelength light from 2.67 and 0.59, respectively, to 2.89 and 1.11, respectively.

Suitable anti-reflective coating materials generally have an index of refraction (n) in the range of about 1.7 to about 2.7 at a wavelength of about 248 nanometers or at a wavelength of about 365 nanometers. Further, an absorptive coefficient (k) of suitable anti-reflective coating materials is generally in the range of about 0.01 to about 1.5 at a wavelength of about 248 nanometers or at a wavelength of about 365 nanometers. The refractive index and the absorptive coefficient required for processing depends on the index of refraction and absorptive coefficient of the photoresist used and the other underlying layers of the substrate assembly upon which the resist layer is formed, as well as the dimensions of the underlying substrate assembly features and layers. Depending on the wavelength, as the amount of silicon in a non-stoichiometric anti-reflective coating material layer increases, the index of refraction and the absorptive coefficient of the anti-reflective coating material typically increases as well. For example, that is generally the case for a wavelength of about 365 nanometers relative to about 248 nanometers.

After the anti-reflective coating material layer 14 is formed on substrate assembly 12, or after an anneal altering the optical properties of the anti-reflective coating material layer 14 has been performed (if an anneal is performed at all to alter the optical properties), resist layer 16 is formed over the anti-reflective coating material layer 14. The resist layer 16 may be formed by conventional resist layer formation methods. For example, a resist solution may be spun over layer 14 and, thereafter, subsequently volatilizing solids from the spun on layer to form a solid resist layer 16.

As shown in FIG. 2, the resist layer 16, e.g., negative or positive-type photoresist, is formed over the anti-reflective coating material layer 14 for use in defining opening 18 in the substrate assembly 12. The photoresist layer 16 may be any suitable photoresist useable in photolithography processes. For example, the photoresist may be a deep ultra-violet (DUV) resist, mid-ultraviolet (MUV) resist, or any other resist used in photolithographic processing.

The resist layer 16 is patterned using conventional photolithography. For example, using a suitable mask, DUV resist may be exposed to wavelengths of about 248 nanometers or other types of resist may be exposed to wavelengths of about 365 nanometers. Thereafter, the photoresist is contacted with a developer solution and the photoresist is selectively removed according to the pattern exposed therein. Opening 18 in the photoresist layer 16 results from the photolithography process and defines the area of the substrate assembly 12 to be removed for attaining the desired structure. In other words, the opening 18 defines the area of the substrate assembly 12 which is to be etched to define opening 18 therethrough as shown in FIG. 3. Patterning of the resist layer 16 results in regions or portions 32 of anti-reflective coating material layer 14 covered by the patterned resist, and portions 30 of the anti-reflective coating material layer 14 exposed through opening 18.

One skilled in the art will recognize that any photolithographic process for patterning the resist and underlying layers may be used according to the present invention. However, depending on the parameters of the photolithography process, the characteristics of the anti-reflective coating material layer 14 will change accordingly. For example, the composition of the layer 14 and thickness of the layer 14 may vary depending upon whether DUV resist exposed to wavelengths in the 248 nanometer region or resist exposed to wavelengths in the 365 nanometer region are used. This is at least in part due to the different reflectivity properties required for the layer 14 in different photolithographic processes.

As shown in FIG. 3, opening 18 is extended through anti-reflective coating material layer 14 and into substrate assembly 12. The opening 18 can be extended by use of conventional methods, such as, for example, a dry plasma etch or a wet etch. For example, after portions of the resist layer 16 have been selectively removed to pattern the substrate assembly 12, a suitable dry etch is used to etch the opening 18 into the substrate assembly 12 down to surface region 34 of the substrate assembly 12. The dry etch of the opening 18 may be performed using different chemistries for different applications. Use of a dry etch is generally preferred due to the ability of dry etchants to etch isotropically and, as such, critical dimensions can be controlled. One illustrative example of a chemistry used for removal of an oxide layer, e.g., a rich BPSG oxide layer, would include the use of a fluorine chemistry, such as $CHF_3$, $SF_6$, or $CF_4$. The dry etch would remove exposed portions 30 of the anti-reflective coating material layer 14 patterned by resist layer 16, in addition to etching the substrate assembly 12 to define the opening 18.

As indicated above, the opening 18 may be etched through the substrate assembly 12 to surface region 34 of substrate assembly 12. For example, the surface region 34 may be a polysilicon-containing region such as in the case where a capacitor electrode structure is formed in the opening, the surface region 34 may be a silicon-containing region such as in the formation of a contact to a source or drain region of a transistor, or may be any other surface region to which an opening is typically etched, e.g., a trench in a silicon substrate, a trench for isolation, a trench used for formation of a capacitor, etc.

After the opening 18 has been etched in the substrate assembly 12, the resist layer 16 is removed resulting in the structure as shown in FIG. 4. The resist layer 16 may be removed using any suitable process, such as an oxygen ash process, e.g., an oxygen-containing plasma process.

As shown in FIGS. 1–3, resist layer 16 is in contact with anti-reflective coating material layer 14. However, it should be understood that in other embodiments, intervening layers can be formed between resist layer 16 and anti-reflective coating material layer 14. If such intervening layers are at least partially transparent to the radiation utilized to pattern resist layer 16, the radiation will penetrate to anti-reflective coating material layer 14 and be absorbed thereby during exposure of the resist layer 16 to the radiation. It is also to be understood that if such intervening layers are present, a pattern of resist layer 16 could be transferred to the intervening layers without extending the pattern to the anti-reflective coating material layer 14. Thus, the invention encompasses embodiments in which anti-reflective coating material layer 14 is not etched.

As described herein, in many cases, it is desirable to retain the anti-reflective coating material layer 14 as opposed to being removed after opening 18 has been defined. As such, and in accordance with the present invention, thermal treatment of the inorganic anti-reflective coating material layer 14 can be used to alter the etch rate thereof when exposed to an etchant, e.g., a wet etchant. Such thermal treatment occurs after the anti-reflective coating material layer 14 has been used to define opening 18 (whether or not an anneal has previously been performed to alter the optical properties of the layer 14, e.g., n and k). Preferably, the anti-reflective coating material layer 14 is thermally treated at a temperature greater than about 400° C. and also preferably less than about 1100° C. to achieve desirable etch rates for the inorganic anti-reflective coating material layer 14. One skilled in the art will recognize that the temperature of the anneal used to decrease the etch rate of the inorganic anti-reflective coating material layer 14 is limited by the maximum temperature the substrate assembly 12 can be subjected to without degradation thereof.

Various thermal treatment processes may be used to achieve desirable etch rates for the anti-reflective coating material layer 14 as described below. For example, a furnace thermal treatment may be performed. Preferably, in the furnace thermal treatment, the inorganic anti-reflective coating material having a thickness in the range of about 100 Å to about 1,000 Å is furnace annealed at a temperature in the range of about 400° C. to about 1050° C. for a time period in the range of about 10 minutes to about 45 minutes; more preferably in the range of about 650° C. to about 850° C. for a time period in the range of about 20 minutes to about 40 minutes.

Further, the thermal treatment may include subjecting the inorganic anti-reflective coating material layer 14 to a rapid thermal anneal, i.e., a rapid thermal process (RTP). Preferably, the rapid thermal anneal of the inorganic anti-reflective coating material layer 14 having a thickness of about 100 Å to about 1,000 Å is performed at a temperature in the range of about 500° C. to about 1100° C. for a time period in the range of about 1 second to about 3 minutes; more preferably in the range of about 800° C. to about 1000° C. for a time period in the range of about 10 seconds to about 60 seconds.

Yet further, the inorganic anti-reflective coating material layer 14 may be subjected to a rapid thermal nitridation process. Preferably, the inorganic anti-reflective coating material layer 14 having a thickness in the range of about 100 Å to about 1,000 Å is subjected to an anneal temperature in the range of about 800° C. to about 1050° C. for a time period in the range of about 1 second to about 60 seconds in a nitrogen-containing atmosphere, e.g., $N_2$; more preferably in the range of about 850° C. to about 1000° C. for a time period in the range of about 10 seconds to about 60 seconds. Other non-reactive gases may also be present, such as argon, helium, etc.

One skilled in the art will recognize that the thermal treatments described above may be carried out in various manners consistent with the applicable treatment. For example, the furnace anneal or any of the other anneals may be performed in multiple steps for a composite time period in the ranges described herein.

Preferably, the thermal treatment performed reduces the etch rate of the inorganic anti-reflective coating material layer 14 to an etch rate of less than about 16 Å per minute when exposed to a particular etchant. If this particular etchant were used prior to the thermal treatment, the etch rate would be greater than about 16 Å per minute, and in many cases much greater than 30 Å per minute. Preferably, the thermally treated anti-reflective coating material layer 14 has an associated etch rate of less than about 10 Å per minute when exposed to the particular etchant; and more preferably less than about 5 Å per minute.

Generally, the etchants used to further extend opening 18 in the substrate assembly 12 as shown by the enlarged size of the opening in FIG. 5 relative to the size of opening 18 in FIG. 4, may include the use of HF-containing etchants or etchant compositions generally including a fluoride salt and a mineral acid, such as $NH_4F$ and $H_3PO_4$. For example, the etchants may be selected from the group of HF-containing etchants such as dilute HF solutions or an etchant sold under the ACSI trade designation SOE, also referred to as oxide etch-1. Further, for example, such as in the etching of oxide material, the etchant may include a solution of 100:1 deionized water:HF, where HF is a commercially available solution including HF and deionized water (HF:DI of about 1:1). Further, for example, etchants used to etch or clean oxides may include a buffered oxide etch (BOE) (also referred to as BHF) which is a dilute solution of HF buffered with $NH_4F$, e.g., such as 10 parts of 454 g $NH_4F$ in 680 ml water and one part 48% HF; may include QE-II which is a wet clean solution available from Olin Hunt under the trade designation QE-II (40% by weight $NH_4F$, and 1.2–1.3% by weight $H_3PO_4$); or may include super-Q solution (40% by weight $NH_4F$, and 4% by weight $H_3PO_4$), also available from Olin Hunt. One skilled in the art will recognize that the wet etchant used will depend on the material of the substrate assembly 12 being etched. For example, if the anti-reflective coating material layer 14 is present over an underlying layer of a material other than an oxide layer, then a different solution may be used.

In many circumstances, it is desirable to etch the anti-reflective coating material layer 14 at a much lower etch rate than the substrate assembly 12. As such, thermal treatment which decreases the etch rate for the inorganic anti-reflective coating material layer 14 is desired to accomplish such selectivity. For example, densified BPSG generally etches at a rate of about 60 Å/minute to about 75 Å/minute in the QE-II solution, at a rate of about 140 Å/minute to about 170 Å/minute in the super Q solution, and at a rate of about 210 Å/minute to about 240 Å/minute in the 100:1 HF:deionized water solution. It may be desired to have a selectivity of at least 3:1 with respect to etching BPSG relative to the inorganic anti-reflective coating material layer 14, have a selectivity of at least 20:1 with respect to etching BPSG relative to the inorganic anti-reflective coating material layer 14, or even have a selectivity of at least 100:1 with respect to etching BPSG relative to the inorganic anti-reflective coating material layer 14. Further, for example, densified TEOS generally etches at a rate of about 28 Å/minute in the 100:1 HF:deionized water solution and at a rate of about 53 Å/minute in the QE-II solution. It may be desirable to have a selectivity of at least about 3:1 for etching TEOS relative to the inorganic anti-reflective coating material layer 14 or even have a selectivity of at least about 10:1 for etching TEOS relative to the inorganic anti-reflective coating material layer 14. With reduced etch rates for the inorganic anti-reflective coating material layer 14 achievable below about 16 Å per minute for HF-based solutions, and even below about 5 Å per minute, such selectivity is achievable as shown further below by the examples.

FIG. 5 shows the resultant structure upon etching of the substrate assembly 12, e.g., extending the etch of opening 18, according to the present invention after thermally treating the inorganic anti-reflective coating material layer 14 to reduce the etch rate thereof. With the high selectivity as described above, material of the substrate assembly 12 is removed from below the inorganic anti-reflective coating material layer 14 without removal of the anti-reflective coating material layer 14. As shown in FIG. 5, the selective etch occurring after the thermal treatment of the inorganic anti-reflective coating material layer 14 results in undercut regions 23 of opening 18 underlying projections, i.e., overhang regions, 22 of the inorganic anti-reflective coating material layer 14. One skilled in the art will recognize that the etchant used to form such undercut regions 23 will depend upon the material of the substrate assembly 12. For example, if the material is an oxide material being etched in the undercut regions, then an etchant such as an HF-based solution as described above may be used.

FIG. 6 shows the structure of FIG. 5 having a material 24 formed in at least a portion of opening 18 and on other surfaces, e.g., layer 14, of the structure. As shown in FIG. 6, which illustrates one application of the present invention, the overhang regions 22 of the anti-reflective coating material layer 14 project over the edges 36 of opening 18. The selective etch performed after the thermal treatment has been used to reduce the etch rate of the anti-reflective coating material layer 14, results in an increase in the dimensional differences between the opening shown by dimension 41 between overhang regions or projections 22 relative to dimension 43 between walls 37 defining the opening 18. Upon filling the opening 18 with material 24, e.g., a dielectric material such as silicon dioxide, the material is first deposited on walls 37 and bottom surface region 34 of the opening 18 and also along surfaces 39 of the projections 22 extending or projecting over the edges 36 of the opening 18. As such, as the material 24 is formed on such surfaces, the opening existing between projections or overhang regions 22 represented by arrow 41 fill with material prior to the opening 18 being completely filled with material 24. As such, a void 26 in the material 24 filling the opening 18 may result. As described herein, a void is defined as any space not occupied by the material 24 in the opening 18.

Such use of the thermally treated anti-reflective coating material layer 14 may be beneficial in forming voids in openings, e.g., trenches, openings for deposition of dielectric materials, etc., such as to, for example, decrease capacitance values for the deposited material used for isolation. Further, if it is desired to leave the thermally treated anti-reflective coating material layer on the substrate assembly for a subsequent photo process, such as in a dual damascene process, the etch rate of the anti-reflective coating material layer may be slowed to match the underlying oxide (TEOS, BPSG) layers.

EXAMPLE

Five different types of anti-reflective coating material layers were deposited on HF cleaned silicon wafers by plasma vapor deposition to a thickness of 500 Å. The five different types of anti-reflective coating material layers included DARC320; I-line DARC; DUV-DARC; HER-DARC; and Fuse-DARC. DARC320 is 25.5% oxygen, 64.8% silicon, and 9.8% nitrogen. I-line DARC is 36% oxygen, 54.1% silicon, and 9.9% nitrogen. DUV-DARC is 36.6% oxygen, 50.1% silicon, and 13.3% nitrogen. HER-DARC is 40.1% oxygen, 53.3% silicon, and 6.5% nitrogen. Further, Fuse-DARC is 55.9% oxygen, 38.9% silicon, and 5.2% nitrogen.

After the anti-reflective coating material layers are formed, they were etched by immersion in a solution of 100:1 deionized water:HF (where HF is the commercially available HF having a composition of deionized water:HF of 1:1). The etch rate was determined and tabulated.

Thereafter, the same anti-reflective coating material layers were subjected to an RTP at 1000° C. in a nitrogen atmosphere for 10 seconds. The thermally treated anti-reflective coating material layers were then etched using the same 100:1 deionized water:HF solution. The etch rate was determined and tabulated.

The results of the etch rate determinations are provided in Table A with the after thermal treatment etch rate also being given as a percentage of the before thermal treatment etch rate.

TABLE A

|  | Etch rate of as deposited DARC in 100:1 HF | Etch rate of DARC after thermal treatment in 100:1 HF | % of after v. before |
| --- | --- | --- | --- |
| DARC320 | 18 Å/minute | 2.2 Å/minute | 12.2 |
| I-line DARC | 23 Å/minute | 3.2 Å/minute | 13.9 |
| DUV-DARC | 72 Å/minute | 4.4 Å/minute | 6.1 |
| HER-DARC | 83 Å/minute | 3.3 Å/minute | 4.0 |
| Fuse-DARC | 84 Å/minute | 9.5 Å/minute | 11.3 |

When comparing the reduced etch rates after thermal treatment to the etch rates of BPSG and TEOS in the same 100:1 deionized water:HF solution, it is shown that a desirable selectivity to BPSG and TEOS can be achieved. For example, as shown above, the etch ratio of BPSG:DARC in 100:1 deionized water:HF solution ranges from about 22:1 to about 110:1. Further, for example, as shown above, the etch ratio of TEOS:DARC in 100:1 deionized water:HF solution ranges from about 3:1 to about 13:1.

In substantially the same manner as described above, the same types of anti-reflective coating material layers were etched in a solution of Super-Q before and after the thermal treatment. The etch rate determinations are provided in Table B with the after thermal treatment etch rate also being given as a percentage of the before thermal treatment etch rate.

TABLE B

|  | Etch rate of as deposited DARC in the Super-Q solution. | Etch rate of DARC after thermal treatment in the Super-Q solution. | % of after v. before |
| --- | --- | --- | --- |
| DARC320 | 74 Å/minute | 13.5 Å/minute | 18.2 |
| I-line DARC | 124 Å/minute | 21.2 Å/minute | 17.1 |
| DUV-DARC | 190 Å/minute | 20.8 Å/minute | 11.0 |
| HER-DARC | 500 Å/minute | 23.8 Å/minute | 4.8 |
| Fuse-DARC | 318 Å/minute | 43.5 Å/minute | 13.7 |

When comparing the reduced etch rates after thermal treatment to the etch rate of BPSG in the Super Q solution, it is shown that a desirable selectivity to BPSG can be achieved. For example, as shown above, the etch ratio of BPSG:DARC in Super Q solution ranges from about 3:1 to about 13:1.

Yet further, in substantially the same manner as described above, the same types of anti-reflective coating material layers were etched in a QEII solution before and after the thermal treatment. The etch rate determinations are provided in Table C with the after thermal treatment etch rate also being given as a percentage of the before thermal treatment etch rate.

TABLE C

| | Etch rate of as deposited DARC in QEII | Etch rate of DARC after thermal treatment in QEII | % of after v. before |
|---|---|---|---|
| DARC320 | 63 Å/minute | 7 Å/minute | 11.1 |
| I-line DARC | 77 Å/minute | 9.8 Å/minute | 12.7 |
| DUV-DARC | 67 Å/minute | 9.1 Å/minute | 13.6 |
| HER-DARC | 222 Å/minute | 11.8 Å/minute | 5.3 |
| Fuse-DARC | 104 Å/minute | 16 Å/minute | 15.4 |

When comparing the reduced etch rates after thermal treatment to the etch rates of BPSG and TEOS in the same QE-II solution, it is shown that a desirable selectivity to BPSG and TEOS can be achieved. For example, as shown above, the etch ratio of BPSG:DARC in QE-II solution ranges from about 4:1 to about 11:1. Further, for example, as shown above, the etch ratio of TEOS:DARC in QE-II solution ranges from about 3:1 to about 7:1.

Further, as shown by the above data, the reduction of etch rate after thermal treatment versus the before thermal treatment etch rate is substantial in each case illustrated. In each case, the etch rate after thermal treatment is always less than 20% of the etch rate before thermal treatment. In most cases, the etch rate after thermal treatment is less than 15% of the etch rate before thermal treatment. Further, in many cases the etch rate after thermal treatment is less than 5% of the etch rate before thermal treatment.

All patents and references cited herein are incorporated in their entirety as if each were incorporated separately. This invention has been described with reference to illustrative embodiments and is not meant to be construed in a limiting sense. As described previously, one skilled in the art will recognize that various other illustrative applications may utilize the anti-reflective coating material layer thermally treated as described herein such that the anti-reflective coating material reduced etch rate properties provide benefit in such applications. Various modifications of the illustrative embodiments, as well as additional embodiments of the invention, will be apparent to persons skilled in the art upon reference to this description.

What is claimed is:

1. A method of forming an anti-reflective coating material layer in the fabrication of integrated circuits, the method comprising:

providing a substrate assembly having a surface;

providing an inorganic anti-reflective coating material layer on the substrate assembly surface, wherein the inorganic anti-reflective coating material layer has an associated etch rate when exposed to an etchant, and further wherein the inorganic anti-reflective coating material layer is $Si_xO_yN_z$:H, where x is in the range of about 0.39 to about 0.65, y is in the range of 0.25 to about 0.56, and z is in the range of about 0.05 to about 0.14;

using the inorganic anti-reflective coating material layer in a photolithographic process; and thermally treating the inorganic anti-reflective coating material layer formed thereon at a temperature in the range of about 400° C. to about 1100° C., wherein the thermally treated anti-reflective coating material layer has an associated etch rate of less than about 16 Å per minute when exposed to the etchant.

2. The method of claim 1, wherein the thermally treated anti-reflective coating material layer has an associated etch rate of less than about 10 Å per minute when exposed to the etchant.

3. The method of claim 2, wherein the thermally treated anti-reflective coating material layer has an associated etch rate of less than about 5 Å per minute when exposed to the etchant.

4. The method of claim 1, wherein the inorganic anti-reflective coating material layer has a thickness in the range of about 100 Å to about 1000 Å, and wherein thermally treating the inorganic anti-reflective coating material layer includes furnace annealing the inorganic anti-reflective coating material layer at a temperature in the range of about 400° C. to about 1050° C. for a time period in the range of about 15 minutes to about 45 minutes.

5. The method of claim 1, wherein the inorganic anti-reflective coating material layer has a thickness in the range of about 100 Å to about 1000 Å, and wherein thermally treating the inorganic anti-reflective coating material layer includes subjecting the inorganic anti-reflective coating material layer to a rapid thermal anneal at a temperature in the range of about 500° C. to about 1100° C. for a time period in the range of about 1 second to about 3 minutes.

6. The method of claim 5, wherein thermally treating the inorganic anti-reflective coating material layer includes subjecting the inorganic anti-reflective coating material layer to a rapid thermal nitridation anneal at a temperature in the range of about 800° C. to about 1050° C. for a time period in the range of about 1 second to about 60 seconds in a nitrogen containing atmosphere.

7. The method of claim 1, wherein the etchant includes one of a hydrofluoric acid containing etchant and an etchant composition comprising a fluoride salt and a mineral acid.

8. The method of claim 7, wherein the etchant is a solution of 100:1 deionized water:HF.

9. A method for use in the fabrication of integrated circuits, the method comprising:

providing a substrate assembly having a surface;

providing an inorganic anti-reflective coating material layer on the substrate assembly surface, wherein the inorganic anti-reflective coating material layer has an associated first etch rate when exposed to an etchant, and further wherein the inorganic anti-reflective coating material layer comprises silicon oxynitride;

providing a layer of resist material over the inorganic anti-reflective coating material layer;

patterning the layer of resist material resulting in exposed regions of the inorganic anti-reflective coating material layer and unexposed regions of the inorganic anti-reflective coating material layer;

removing the exposed regions of the inorganic anti-reflective coating material layer;

removing the patterned layer of resist material; and thermally treating the unexposed regions of the inorganic anti-reflective coating material layer after removing the patterned layer of resist material, wherein the thermally treated unexposed regions of the anti-reflective coating material layer have an associated second etch rate less than the first etch rate.

10. The method of claim 9, wherein the second etch rate is less than about 16 Å per minute when exposed to the etchant.

11. The method of claim 10, wherein the second etch rate is less than about 10 Å per minute when exposed to the etchant.

12. The method of claim 9, wherein the second etch rate is less than about 20% of the first etch rate.

13. The method of claim 9, wherein thermally treating the unexposed regions of the inorganic anti-reflective coating material layer includes thermally treating the unexposed regions of the inorganic anti-reflective coating material layer at a temperature in the range of about 400° C. to about 1100° C.

14. The method of claim 9, wherein the inorganic anti-reflective coating material layer is $Si_xO_yN_z$:H, where x is in the range of about 0.39 to about 0.65, y is in the range of 0.25 to about 0.56, and z is in the range of about 0.05 to about 0.14.

15. The method of claim 9, wherein the etchant includes one of a hydrofluoric acid containing etchant and an etchant composition comprising a fluoride salt and a mineral acid.

16. The method of claim 15, wherein the etchant is a solution of 100:1 deionized water:HF.

17. A method for use in the fabrication of integrated circuits, the method comprising:
providing a substrate assembly having a surface;
providing an inorganic anti-reflective coating material layer on the substrate assembly surface;
annealing the inorganic anti-reflective coating material layer to alter the optical properties thereof;
providing a layer of resist material over the inorganic anti-reflective coating material layer;
patterning the layer of resist material resulting in exposed regions of the inorganic anti-reflective coating material layer and unexposed regions of the inorganic anti-reflective coating material layer;
removing the exposed regions of the inorganic anti-reflective coating material layer and at least a portion of the substrate assembly thereunder;
removing the patterned layer of resist material; and
thermally treating the unexposed regions of the inorganic anti-reflective coating material layer to alter the etch rate of the unexposed regions of the anti-reflective coating material layer.

18. The method of claim 17, wherein the etch rate is altered such that the etch rate is less than about 16 Å per minute when exposed to an etchant.

19. The method of claim 18, wherein the etch rate is less than about 10 Å per minute when exposed to the etchant.

20. The method of claim 19, wherein the etch rate after the thermal treatment is less than about 20% of an etch rate for the inorganic anti-reflective coating material layer when exposed to the etchant prior to the thermal treatment.

21. The method of claim 17, wherein thermally treating the unexposed regions of the inorganic anti-reflective coating material layer includes thermally treating the unexposed regions of the inorganic anti-reflective coating material layer at a temperature in the range of about 400° C. to about 1100° C.

22. The method of claim 18, wherein the inorganic anti-reflective coating material layer is $Si_xO_yN_z$:H, where x is in the range of about 0.39 to about 0.65, y is in the range of 0.25 to about 0.56, and z is in the range of about 0.05 to about 0.14.

23. The method of claim 17, wherein the etchant includes one of a hydrofluoric acid containing etchant and an etchant composition comprising a fluoride salt and a mineral acid.

24. A method for use in the fabrication of integrated circuits, the method comprising:
providing a substrate assembly having a surface;
providing an inorganic anti-reflective coating material layer on the substrate assembly surface, wherein the inorganic anti-reflective coating material layer has an associated first etch rate when exposed to an etchant;
providing a layer of resist material over the inorganic anti-reflective coating material layer;
patterning the layer of resist material resulting in exposed regions of the inorganic anti-reflective coating material layer defining at least one opening in the substrate assembly;
removing the exposed regions of the inorganic anti-reflective coating material layer;
etching the substrate assembly resulting in the at least one opening therein;
removing the patterned layer of resist material;
thermally treating the inorganic anti-reflective coating material layer remaining after the exposed regions are removed, wherein the thermally treated remaining anti-reflective coating material layer has an associated second etch rate less than the first etch rate;
further etching the substrate assembly such that regions of the substrate assembly underlying the remaining anti-reflective coating material layer are removed; and
filling the opening with a material such that a void is formed in the opening.

25. The method of claim 24, wherein further etching the substrate assembly results in overhang regions of the anti-reflective coating material layer extending over the opening of the substrate assembly, and further wherein filling the opening includes forming material between overhang regions prior to completely filling the opening with the material such that the void is formed.

26. The method of claim 24, wherein the substrate assembly etched includes BPSG, and further wherein the ratio of etch rates between BPSG:anti-reflective coating material layer using the etchant is at least about 3:1.

27. The method of claim 24, wherein the substrate assembly etched includes TEOS, and further wherein the ratio of etch rates between TEOS:anti-reflective coating material layer using the etchant is greater than 3:1.

28. The method of claim 24, wherein the second etch rate is less than about 16 Å per minute when exposed to the etchant.

29. The method of claim 28, wherein the second etch rate is less than about 10 Å per minute when exposed to the etchant.

30. The method of claim 24, wherein the second etch rate is less than about 20% of the first etch rate.

31. The method of claim 24, wherein thermally treating the remaining inorganic anti-reflective coating material layer includes thermally treating at a temperature in the range of about 400° C. to about 1100° C.

32. The method of claim 24, wherein the inorganic anti-reflective coating material layer is $Si_xO_yN_z$:H, where x is in the range of about 0.39 to about 0.65, y is in the range of 0.25 to about 0.56, and z is in the range of about 0.05 to about 0.14.

33. The method of claim 24, wherein the etchant includes one of a hydrofluoric acid containing etchant and an etchant composition comprising a fluoride salt and a mineral acid.

34. A method for use in the fabrication of integrated circuits, the method comprising:

providing a substrate assembly having a surface;

providing an inorganic anti-reflective coating material layer on the substrate assembly surface, wherein the inorganic anti-reflective coating material layer has an associated first etch rate when exposed to an etchant, and further wherein the inorganic anti-reflective coating material layer includes regions thereof removed such that one or more openings are formed in the substrate assembly;

thermally treating the inorganic anti-reflective coating material layer remaining after the regions are removed, wherein the thermally treated remaining anti-reflective coating material layer has an associated second etch rate less than the first etch rate;

etching the substrate assembly such that regions of the substrate assembly underlying the thermally treated anti-reflective coating material layer are removed; and filling the opening with a material such that a void is formed in the opening.

35. The method of claim 34, wherein further etching the substrate assembly results in overhang regions of the anti-reflective coating material layer extending over the opening in the substrate assembly, and further wherein filling the opening includes forming material between at least two overhang regions prior to completely filling the opening with the material such that the void is formed.

36. A method of forming an anti-reflective coating material layer in the fabrication of integrated circuits, the method comprising:

providing a substrate assembly having a surface;

providing an inorganic anti-reflective coating material layer on the substrate assembly surface, wherein the inorganic anti-reflective coating material layer has an associated etch rate when exposed to an etchant; and thermally treating the inorganic anti-reflective coating material layer at a temperature in the range of about 400° C. to about 1100° C., wherein an associated etch rate for the thermally treated anti-reflective coating material layer is less than about 20% of the associated etch rate for the inorganic anti-reflective coating material layer prior to being thermally treated, and further wherein the inorganic anti-reflective coating material layer is $Si_xO_yN_z$:H, where x is in the range of about 0.39 to about 0.65, y is in the range of 0.25 to about 0.56, and z is in the range of about 0.05 to about 0.14.

37. The method of claim 36, wherein the associated etch rate for the thermally treated anti-reflective coating material layer is less than about 15% of the associated etch rate for the inorganic anti-reflective coating material layer prior to being thermally treated.

38. The method of claim 37, wherein the associated etch rate for the thermally treated anti-reflective coating material layer is less than about 5% of the associated etch rate for the inorganic anti-reflective coating material layer prior to being thermally treated.

39. The method of claim 36, wherein the inorganic anti-reflective coating material layer has a thickness in the range of about 100 Å to about 1000 Å, and wherein thermally treating the inorganic anti-reflective coating material layer includes furnace annealing the inorganic anti-reflective coating material layer at a temperature in the range of about 400° C. to about 1050° C. for a time period in the range of about 15 minutes to about 45 minutes.

40. The method of claim 36, wherein the inorganic anti-reflective coating material layer has a thickness in the range of about 100 Å to about 1000 Å, and wherein thermally treating the inorganic anti-reflective coating material layer includes subjecting the inorganic anti-reflective coating material layer to a rapid thermal anneal at a temperature in the range of about 500° C. to about 1100° C. for a time period in the range of about 1 second to about 3 minutes.

41. The method of claim 40, wherein thermally treating the inorganic anti-reflective coating material layer includes subjecting the inorganic anti-reflective coating material layer to a rapid thermal nitridation anneal at a temperature in the range of about 800° C. to about 1050° C. for a time period in the range of about 1 second to about 60 seconds in a nitrogen containing atmosphere.

42. A method of etching in the fabrication of integrated circuits, the method comprising:

providing a substrate assembly having a surface, wherein the substrate assembly surface includes BPSG, and further wherein the BPSG has an associated etch rate when exposed to an etchant;

providing an inorganic anti-reflective coating material layer relative to the substrate assembly surface; and thermally treating the inorganic anti-reflective coating material layer at a temperature in the range of about 400° C. to about 1100° C., wherein the thermally treated anti-reflective coating material layer has an associated etch rate when exposed to the etchant, and further wherein the ratio of etch rates between BPSG:anti-reflective coating material layer when exposed to the etchant is at least about 3:1.

43. The method of claim 42, wherein the ratio of etch rates between BPSG:anti-reflective coating material layer when exposed to the etchant is at least about 20:1.

44. The method of claim 43, wherein the ratio of etch rates between BPSG:anti-reflective coating material layer when exposed to the etchant is at least about 100:1.

45. The method of claim 44, wherein the etchant includes one of a hydrofluoric acid containing etchant.

46. The method of claim 45, wherein the etchant is a solution of 100:1 deionized water:HF.

47. The method of claim 42, wherein the inorganic anti-reflective coating material layer is $Si_xO_yN_z$:H, where x is in the range of about 0.39 to about 0.65, y is in the range of 0.25 to about 0.56, and z is in the range of about 0.05 to about 0.14.

48. A method of etching in the fabrication of integrated circuits, the method comprising:

providing a substrate assembly having a surface, wherein the substrate assembly surface includes TEOS, and further wherein the TEOS has an associated etch rate when exposed to an etchant;

providing an inorganic anti-reflective coating material layer relative to the substrate assembly surface; and thermally treating the inorganic anti-reflective coating material layer at a temperature in the range of about 400° C. to about 1100° C., wherein the thermally treated anti-reflective coating material layer has an associated etch rate when exposed to the etchant, and further wherein the ratio of etch rates between TEOS:anti-reflective coating material layer when exposed to the etchant is at least about 3:1.

49. The method of claim 48, wherein the ratio of etch rates between TEOS:anti-reflective coating material layer when exposed to the etchant is at least about 10:1.

50. The method of claim 48, wherein the inorganic anti-reflective coating material layer is $Si_xO_yN_z$:H, where x is in the range of about 0.39 to about 0.65, y is in the range of 0.25 to about 0.56, and z is in the range of about 0.05 to about 0.14.

51. An anti-reflective coating material layer consisting essentially of $Si_xO_yN_z$:H, where x is in the range of about 0.39 to about 0.65, y is in the range of about 0.25 to about 0.56, z is in the range of about 0.05 to about 0.14, and further wherein an etch rate for the inorganic anti-reflective coating material layer when exposed to an etchant is less than about 16 Å per minute.

52. The anti-reflective coating material layer of claim 51, wherein the etch rate for the inorganic anti-reflective coating material layer when exposed to the etchant is less than 10 Å per minute.

53. The anti-reflective coating material layer of claim 52, wherein the etch rate for the inoganic anti-reflective coating material layer when exposed to the etchant is less than 5 Å per minute.

54. A method of forming an anti-reflective coating material layer in the fabrication of integrated circuits, the method comprising:
    providing a substrate assembly having a surface;
    providing an inorganic anti-reflective coating material layer on the substrate assembly surface, wherein the inorganic anti-reflective coating material layer has an associated etch rate when exposed to an etchant, and further wherein the inorganic anti-reflective coating material layer is $Si_xO_yN_z$:H, where x is in the range of about 0.39 to about 0.65, y is in the range of 0.25 to about 0.56, and z is in the range of about 0.05 to about 0.14; and
    thermally treating the inorganic anti-reflective coating material layer formed thereon at a temperature in the range of about 400° C. to about 1100°C., wherein the thermally treated anti-reflective coating material layer has an associated etch rate of less than about 10 Å per minute when exposed to the etchant.

55. The method of claim 54, wherein the thermally treated anti-reflective coating material layer has an associated etch rate of less than about 5 Å per minute when exposed to the etchant.

56. The method of claim 54, wherein the inorganic anti-reflective coating material layer has a thickness in the range of about 100 Å to about 1000 Å, and wherein thermally treating the inorganic anti-reflective coating material layer includes furnace annealing the inorganic anti-reflective coating material layer at a temperature in the range of about 400° C. to about 1050° C. for a time period in the range of about 15 minutes to about 45 minutes.

57. The method of claim 54, wherein the inorganic anti-reflective coating material layer has a thickness in the range of about 100 Å to about 1000 Å, and wherein thermally treating the inorganic anti-reflective coating material layer includes subjecting the inorganic anti-reflective coating material layer to a rapid thermal anneal at a temperature in the range of about 500° C. to about 1100° C. for a time period in the range of about 1 second to about 3 minutes.

58. The method of claim 57, wherein thermally treating the inorganic anti-reflective coating material layer includes subjecting the inorganic anti-reflective coating material layer to a rapid thermal nitridation anneal at a temperature in the range of about 800° C. to about 1050° C. for a time period in the range of about 1 second to about 60 seconds in a nitrogen containing atmosphere.

59. The method of claim 54, wherein the etchant includes one of a hydrofluoric acid containing etchant and an etchant composition comprising a fluoride salt and a mineral acid.

60. The method of claim 59, wherein the etchant is a solution of 100:1 deionized water:HF.

61. A method for use in the fabrication of integrated circuits, the method comprising:
    providing a substrate assembly having a surface;
    providing an inorganic anti-reflective coating material layer comprising silicon oxynitride on the substrate assembly surface, wherein the inorganic anti-reflective coating material layer has an associated first etch rate when exposed to an etchant;
    providing a layer of resist material over the inorganic anti-reflective coating material layer;
    patterning the layer of resist material resulting in exposed regions of the inorganic anti-reflective coating material layer and unexposed regions of the inorganic anti-reflective coating material layer;
    removing the exposed regions of the inorganic anti-reflective coating material layer;
    removing the patterned layer of resist material; and
    thermally treating the unexposed regions of the inorganic anti-reflective coating material layer, wherein the thermally treated unexposed regions of the anti-reflective coating material layer has an associated second etch rate less than the first etch rate.

62. The method of claim 61, wherein the second etch rate is less than about 16 Å per minute when exposed to the etchant.

63. The method of claim 62, wherein the second etch rate is less than about 10 Å per minute when exposed to the etchant.

64. The method of claim 61, wherein the second etch rate is less than about 20% of the first etch rate.

65. The method of claim 61, wherein thermally treating the unexposed regions of the inorganic anti-reflective coating material layer includes thermally treating the unexposed regions of the inorganic anti-reflective coating material layer at a temperature in the range of about 400° C. to about 1100° C.

66. The method of claim 61, wherein the inorganic anti-reflective coating material layer is $Si_xO_yN_z$:H, where x is in the range of about 0.39 to about 0.65, y is in the range of 0.25 to about 0.56, and z is in the range of about 0.05 to about 0.14.

67. The method of claim 61, wherein the etchant includes one of a hydrofluoric acid containing etchant and an etchant composition comprising a fluoride salt and a mineral acid.

68. The method of claim 67, wherein the etchant is a solution of 100:1 deionized water:HF.

69. A method for use in the fabrication of integrated circuits, the method comprising:
    providing a substrate assembly having a surface;
    providing an inorganic anti-reflective coating material layer on the substrate assembly surface, wherein the inorganic anti-reflective coating material layer is $Si_xO_yN_z$:H, where x is in the range of about 0.39 to about 0.65, y is in the range of 0.25 to about 0.56, and z is in the range of about 0.05 to about 0.14;
    providing a layer of resist material over the inorganic anti-reflective coating material layer;
    patterning the layer of resist material resulting in exposed regions of the inorganic anti-reflective coating material layer and unexposed regions of the inorganic anti-reflective coating material layer;
    removing the exposed regions of the inorganic anti-reflective coating material layer and at least a portion of the substrate assembly thereunder;

removing the patterned layer of resist material; and thermally treating the unexposed regions of the inorganic anti-reflective coating material layer at a temperature in the range of about 400° C. to about 1100° C., wherein an associated etch rate for the thermally treated anti-reflective coating material layer is less than about 20% of the associated etch rate for the inorganic anti-reflective coating material layer prior to being thermally treated.

70. The method of claim 69, wherein the associated etch rate for the thermally treated anti-reflective coating material layer is less than about 15% of the associated etch rate for the inorganic anti-reflective coating material layer prior to being thermally treated.

71. The method of claim 70, wherein the associated etch rate for the thermally treated anti-reflective coating material layer is less than about 5% of the associated etch rate for the inorganic anti-reflective coating material layer prior to being thermally treated.

72. The method of claim 69, wherein the inorganic anti-reflective coating material layer has a thickness in the range of about 100 Å to about 1000 Å, and wherein thermally treating the unexposed regions of the inorganic anti-reflective coating material layer includes furnace annealing the unexposed regions of the inorganic anti-reflective coating material layer at a temperature in the range of about 400° C. to about 1050° C. for a time period in the range of about 15 minutes to about 45 minutes.

73. The method of claim 69, wherein the inorganic anti-reflective coating material layer has a thickness in the range of about 100 Å to about 1000 Å, and wherein thermally treating the unexposed regions of the inorganic anti-reflective coating material layer includes subjecting the unexposed regions of the inorganic anti-reflective coating material layer to a rapid thermal anneal at a temperature in the range of about 500° C. to about 1100° C. for a time period in the range of about 1 second to about 3 minutes.

74. The method of claim 23, wherein thermally treating the unexposed regions of the inorganic anti-reflective coating material layer includes subjecting the unexposed regions of the inorganic anti-reflective coating material layer to a rapid thermal nitridation anneal at a temperature in the range of about 800° C. to about 1050° C. for a time period in the range of about 1 second to about 60 seconds in a nitrogen containing atmosphere.

75. A method of forming an anti-reflective coating material layer int eh fabrication of integrated circuits, the method comprising:

providing a substrate assembly having a surface;

providing an inorganic anti-reflective coating material layer on the substrate assembly surface, wherein the inorganic anti-reflective coating material layer has an associated etch rate when exposed to an etchant; and thermally treating the inorganic anti-reflective coating material layer, wherein thermally treating the inorganic anti-reflective coating material layer includes subjecting the inorganic anti-reflective coating material layer to a rapid thermal nitridation anneal at a temperature in the range of about 800° C. to about 1050° C. for a time period in the range of about 1 second to about 60 seconds in a nitrogen containing atmosphere, and further wherein an associated etch rate for the thermally treated anti-reflective coating material layer is less than about 20% of the associated etch rate for the inorganic anti-reflective coating material layer prior to being thermally treated.

76. The method of claim 75, wherein the associated etch rate for the thermally treated anti-reflective coating material layer is less than about 15% of the associated etch rate for the inorganic anti-reflective coating material layer prior to being thermally treated.

77. The method of claim 76, wherein the associated etch rate for the thermally treated anti-reflective coating material layer is less than about 5% of the associated etch rate for the inorganic anti-reflective coating material layer prior to being thermally treated.

78. The method of claim 75, wherein the inorganic anti-reflective coating material layer is $Si_xO_yN_z{:}H$, where x is in the range of about 0.39 to about 0.65, y is in the range of 0.25 to about 0.56, and z is in the range of about 0.05 to about 0.14.

* * * * *

UNITED STATES PATENT AND TRADEMARK OFFICE
CERTIFICATE OF CORRECTION

PATENT NO. : 6,444,588 B1
DATED : September 3, 2002
INVENTOR(S) : Holscher et al.

It is certified that error appears in the above-identified patent and that said Letters Patent is hereby corrected as shown below:

Column 8,
Line 55, please delete "$[C_nH_{2+1}]_2NH$", and insert -- $[C_nH_{2n+1}]_2NH$ --;

Column 23,
Line 38, please delete "23" and insert -- 73 --;

Column 24,
Line 5, please delete "int eh" and insert -- in the --;

Signed and Sealed this

Eighth Day of April, 2003

JAMES E. ROGAN
*Director of the United States Patent and Trademark Office*